United States Patent [19]

Karp et al.

[11] Patent Number: 4,675,848
[45] Date of Patent: Jun. 23, 1987

[54] DYNAMIC RAM MEMORY

[75] Inventors: Joel A. Karp, Atherton; Ilbok Lee, Los Altos Hills, both of Calif.

[73] Assignee: Visic, Inc., San Jose, Calif.

[21] Appl. No.: 621,848

[22] Filed: Jun. 18, 1984

[51] Int. Cl.⁴ ............................................. G11C 11/40
[52] U.S. Cl. ..................................... 365/189; 365/230
[58] Field of Search ............... 365/182, 149, 150, 189, 365/230

[56] References Cited

U.S. PATENT DOCUMENTS 3,209,337  9/1965  Crawford ........................... 365/189
3,965,459  6/1976  Spencer et al. ..................... 365/189

Primary Examiner—Terrell W. Fears
Attorney, Agent, or Firm—Flehr, Hohbach, Test, Albritton & Herbert

[57] ABSTRACT

There is provided an improved MOS dynamic random access memory (DRAM) device having an array of dynamic RAM cells accessed by word and bit lines. Each memory cell comprises a single field-effect transistor coupled by its source to the gate of an MOS storage capacitor. The word lines are coupled to their respective memory cells at the gate of the field-effect transistor therein, while the bit lines are coupled to their respective memory cells at the drain of the field-effect transistor. The bit lines are organized into pairs of adjacent polysilicon lines that are coupled to all the memory cells on both sides of the bit lines in an alternating configuration. The word lines are coupled to alternating pairs of cells on opposite sides of the word lines.

15 Claims, 14 Drawing Figures

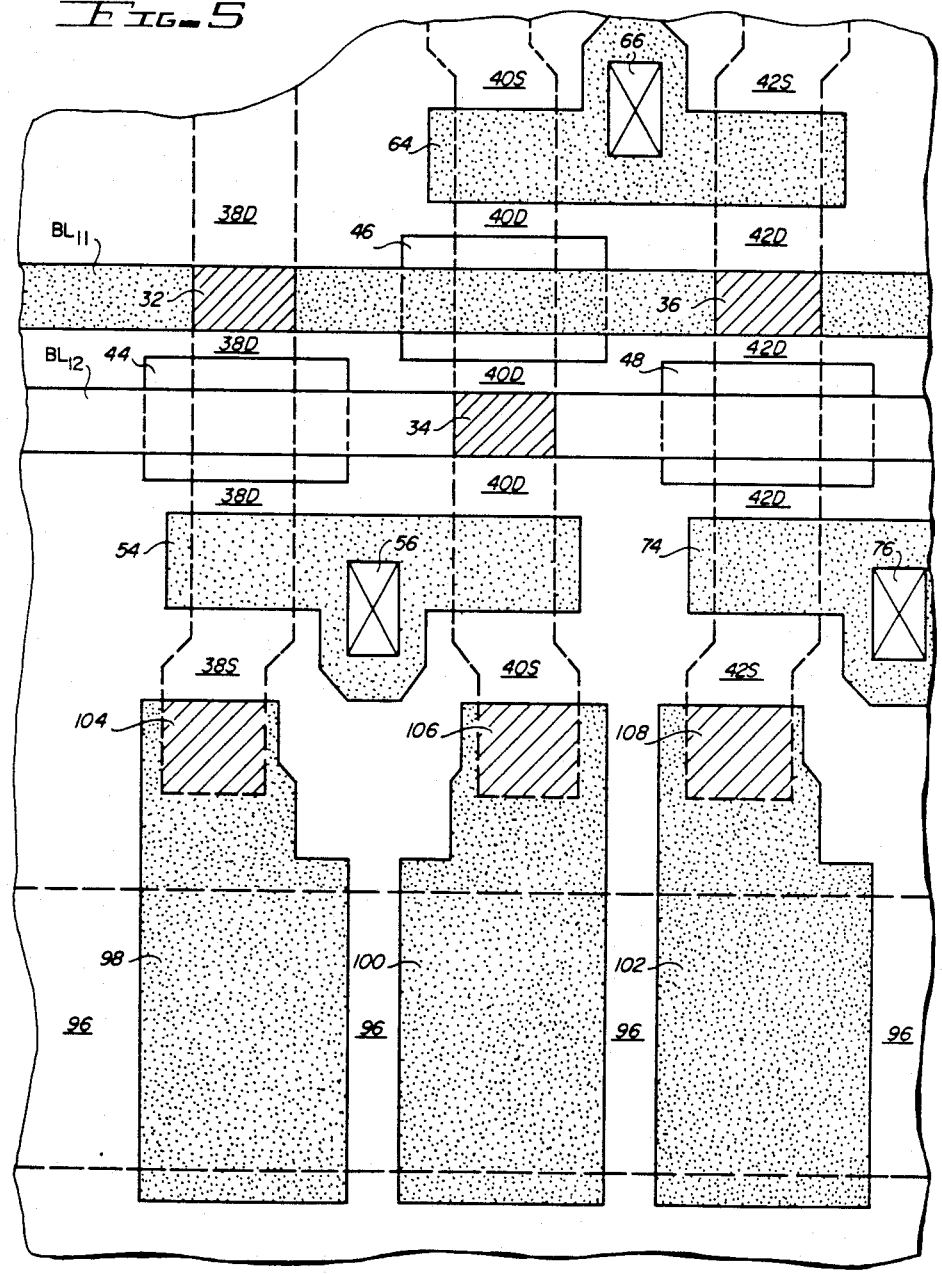

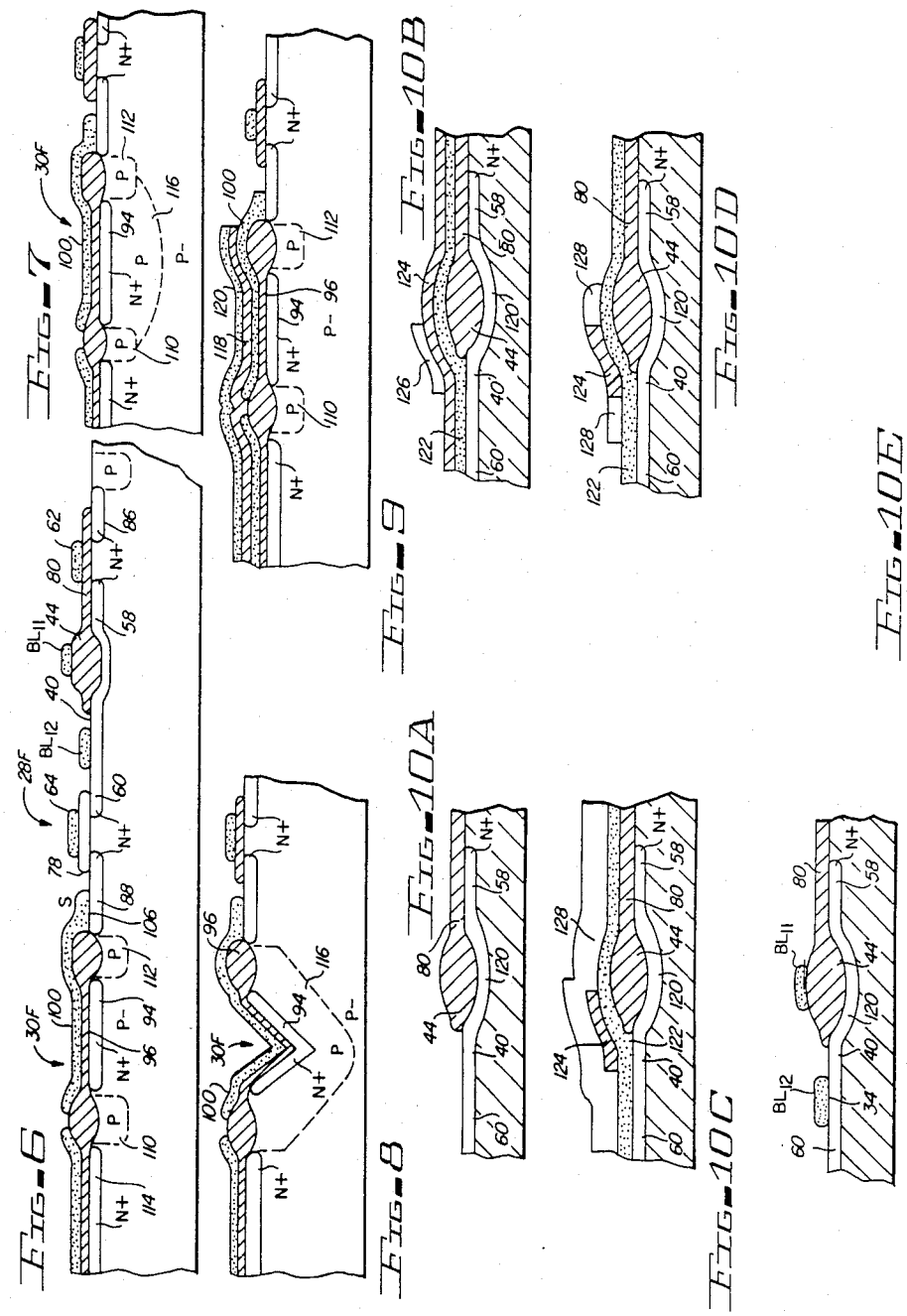

DYNAMIC RAM MEMORY

This invention relates generally to dynamic RAM memory arrays, and fabrication methods therefor, and, more particularly, to an improved and simplified semiconductor dynamic RAM memory array.

Generally, in a semiconductor random-access memory (RAM), bits of information are stored in specific locations. Word and bit lines are provided for addressing a particular location for writing data (a "1" or "∅") into the addressed location, and at least one line (a bit sense line) is used for sensing or reading the data from the addressed location. The time required to complete the operation of writing the data or information (a "1" or "∅") into a memory location is referred to as the write-access time, and the time for sensing or reading the data is referred to as the read-access time. Usually, an array of memory cells is accessed by connecting each row of memory cells to a word line and connecting each column of cells to a bit line. The "1" or "∅" charge state of a semiconductor dynamic memory cell is stored on its capacitor. Due to leakage of charge from the capacitor, dynamic RAM (DRAM) memory cells have to be periodically refreshed. The lapsed time between refresh operations is referred to as the refresh time.

Exemplary prior art DRAM cells utilized separate access paths to the storage capacitor $C_s$ for writing and reading operations, as shown in FIG. 1. However, such memory cells usually required three transistors T1, T2, and T3, and used a large amount of chip area per memory cell. The growing need for large scale memory arrays made this type of prior art impractical.

It is well known that a single bit of information can be stored on a single capacitor, exemplified by the basic single-capacitor plus one MOS-transfer-device memory cell. Additional circuitry is required to allow reading, writing and refreshing operations. Nonetheless, the simple single-capacitor memory cell shown in FIG. 2 is generally accepted as the most compact and desirable cell configuration for semiconductor memory arrays.

Many semiconductor memory devices utilize MOS technology because of power and chip area savings. However, a known difficulty with simple one-transistor/one-capacitor MOS memory cells is maintaining a large enough storage capacitance $C_s$, in comparison to the bit-line capacitance to provide adequate sense signal margin during the reading operation. Thus, it has been an ongoing effort in the semiconductor industry to provide a dynamic RAM (DRAM) cell comprising a single transistor and single capacitor characterized by optimum access time and signal level.

One method for improving access and refresh time characteristics included utilizing various manufacturing processes and materials, while attempting to rely primarily on the single-transistor/single-capacitor memory cell configuration. Such processes included complex and therefore less economical double-poly and triple-poly designs. Initial double-poly DRAM cells utilized the first polysilicon layer for a capacitor plate, diffused bit lines, and a metal word line contacting a second polysilicon layer which formed the gate of the select transistor, T. Early embodiments of single-poly structures (see U.S. Pat. No. 4,025,907, Karp, et al.) resulted in simpler processing, but the amount of storage capacitance $C_s$ was relatively low. Attempts to improve upon this condition led to double- and triple-polysilicon versions, as exemplified in U.S. Pat. No. 4,233,675 (Lee, et al.). This type of cell was generally provided with a polysilicon word line and a metal bit line. Later, refractory metal silicide word lines replaced the slower polysilicon word lines. While all these methods were directed toward increasing the ratio of $C_s$ to data line capacitance, their development resulted in ever-increasing processing complexity, thus adversely affecting the economy of their manufacture. In addition, the storage capacitor on these DRAM cells (with the exception of those described in the Lee, et al., patent) generally comprised an inverted silicon region capacitor which was referenced to the substrate. The substrate was subject to noise variations which reduced the effectiveness of the inverted silicon storage capacitor.

Thus, the need exists to provide a DRAM memory cell which utilizes the basic single-transistor/single-capacitor cell configuration, yet provides optimum storage and access time characteristics, and utilizes a simplified single-Poly configuration.

It is an object of the present invention to provide an improved DRAM memory cell. It is desireable for the improved DRAM cell to utilize a storage capacitor configuration which requires only a single polysilicon layer as compared to the more complex double- and triple-polysilicon layered capacitors disclosed in the relevant prior art. Further, it is desirable to provide a single-poly DRAM cell which utilizes metal word line architecture to provide fast access times and performance as compared to prior art polysilicon or silicide word lines. The use of metal word lines generally necessitates that the bit lines be either diffused N or polysilicon. Thus, it is desirable to utilize polysilicon bit lines which are contacted through buried contacts.

It is another object of this invention to provide a DRAM cell with greater packing density through the use of parallel polysilicon bit lines which make alternating and staggered buried contacts with the densely packed storage cells. Packing density can be increased further by utilizing a storage capacitor which is essentially isolated from the substrate, thereby increasing isolation between adjacent cells.

Yet another object of the invention is to provide a DRAM cell with sufficiently narrow cell pitch to allow a 256K memory device to fit into a 16-pin plastic package.

It is still another object of the present invention to provide a dynamic RAM cell configuration which utilizes a storage capacitor configuration which is adaptable to V-groove technology or other 3-D fabrication techniques for increased storage capabilities. Further, it is advantageous for the processing of the inventive single-poly RAM cell to be readily adaptable to double-polysilicon technology for further increase of capacitance as needed.

Accordingly, a MOS dynamic random access memory (DRAM) device comprises an array of dynamic RAM cells accessed by metal word lines and polysilicon bit lines. Each memory cell comprises a single field-effect transistor coupled by its source to the gate of an MOS storage capacitor. The word lines are coupled to their respective memory cells at the gate of the field-effect transistor therein, while the bit lines are coupled to their respective memory cells at the drain of the field-effect transistor. The bit lines are organized into pairs of adjacent polysilicon lines that are coupled to all the memory cells on both sides of the bit lines in an alternating configuration. The word lines are coupled to alternating pairs of cells on opposite sides of the word lines. A dummy word line is coupled to each bit line.

The invention and objects and features thereof will be more readily apparent from the following detailed description and appended claims when taken in conjunction with the drawings, in which FIG. 1 is a schematic diagram of a three transistor prior art memory cell.

FIG. 5 is a partial plan view of the surface layout of the memory array shown in FIG. 4.

FIG. 6 is a vertical cross-sectional view of a single memory cell of FIG. 5 prior to metallization and final oxide procesing steps.

FIG. 7 is a vertical cross-sectional view of a second embodiment of the storage capacitor portion of the single memory cell shown in FIG. 6.

FIG. 8 is a vertical cross-sectional view of a third embodiment of the storage capacitor portion of the single memory cell shown in FIG. 6.

FIG. 9 is a vertical cross-sectional view of a fourth embodiment of the storage capacitor portion of the single memory cell shown in FIG. 6.

FIGS. 10A through 10E are progressive cross-sectional views depicting the steps for processing edge-defined bit lines utilizing an anisotropic etching process.

The terms IGFET (isolation gate field effect transistor), FET (field effect transistor) and MOS (metal oxide silicon transistor) are used interchangeably. While the invention is described in terms of a preferred embodiment using polysilicon-gate, N-channel, silicon-substrate MOS technology, the invention is believed to be equally applicable to other IGFET technologies.

Figure 1:
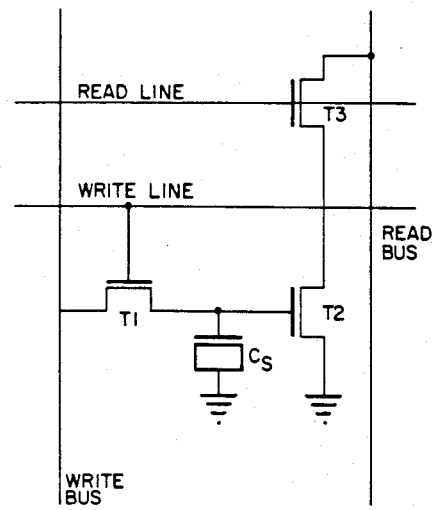

FIG. 1 is illustrative of one prior art approach to the DRAM cell. Separate read and write paths are provided by a three transistor configuration. The storage capacitor $C_s$ comprises the parasitic capacitance seen at the gate of $T_2$. The use of three transistors per cell and the separate read and write paths requires substantial silicon chip area and is inappropriate for high-density DRAM arrays.

Figure 2:
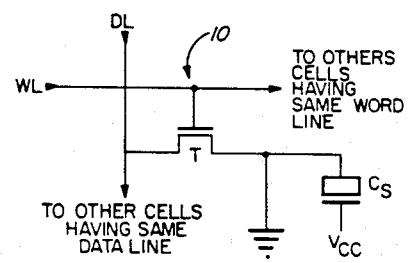
FIG. 2 is a simplified schematic diagram of a prior art single-transistor/single-capacitor memory cell.

The single-transistor/single-capacitor DRAM cell shown in FIG. 2 is much more suited to large DRAM arrays. A single FET transfer device T has its gate coupled to the word line WL and its source to the bit line BL. The drain of transistor T is coupled to the FET type capacitor $C_s$, which has usually comprised an inverted silicon region capacitor which was subject to substrate-induced noise. Additional circuitry (not shown) peripheral to the memory cell array is used to allow reading, writing, and refreshing. While there are many prior art embodiments of the basic DRAM cell of FIG. 2, these embodiments are subject to the disadvantages described hereinbefore.

Figure 3:
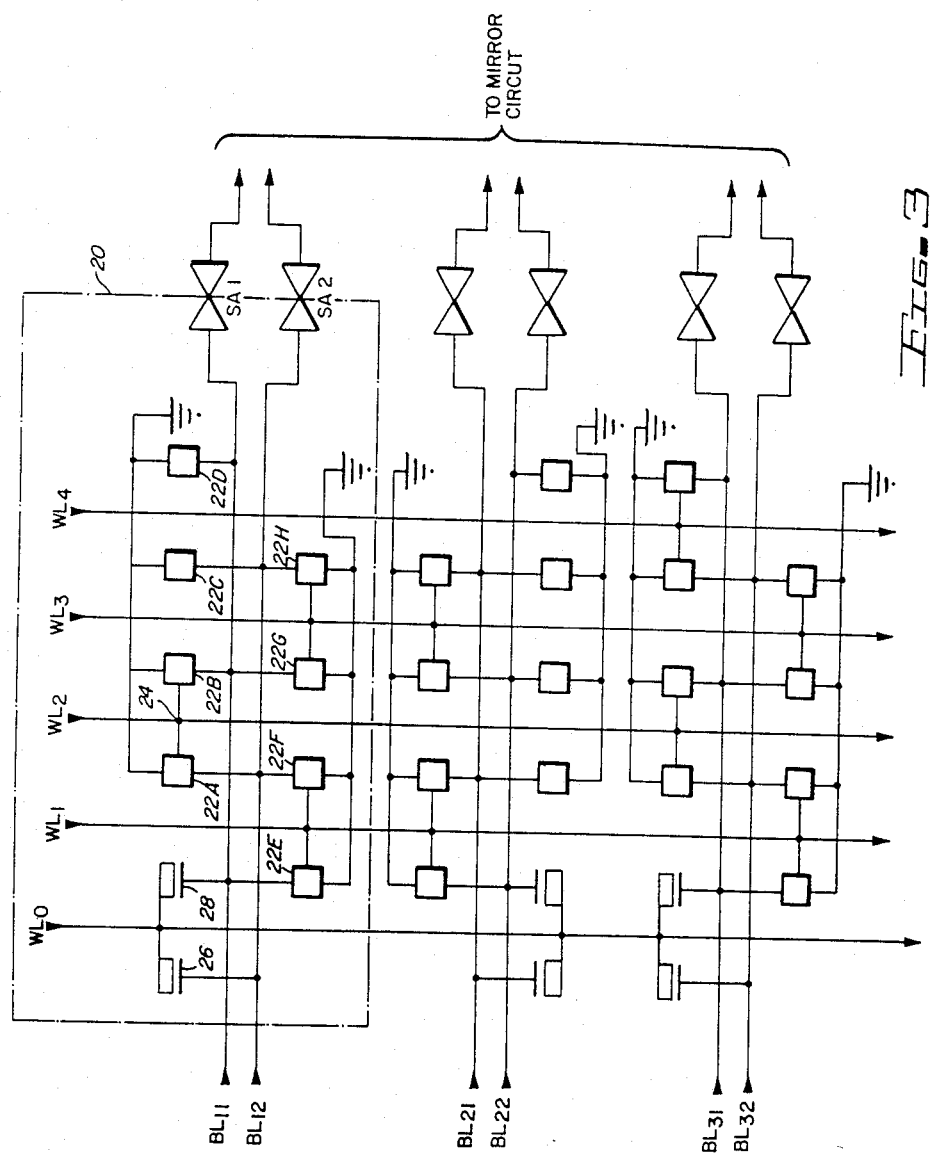
FIG. 3 is a block diagram (with some devices shown in schematic form) of a portion of the inventive dynamic RAM memory showing a plurality of eight-cell memory arrays and their interconnection to the word and bit lines.

Shown in FIG. 3 is a general layout of one embodiment of the dynamic RAM array comprising the invention. The array in FIG. 3 is organized into subarrays 20a, 20b and 20c of eight dynamic RAM cells 22A through 22H. A plurality of parallel word lines $WL_1$, $WL_2$, $WL_3$, $WL_4$ communicate with the eight RAM cells 22A through 22H. Each word line, $WL_2$ for example, is coupled at 24 to pairs of adjacent RAM cells 22A and 22B on opposite sides of the word line. Parallel word lines $WL_1$, $WL_2$, $WL_3$, $WL_4$ are coupled to a plurality of subarrays similar to the subarray 20a as shown in FIG. 3. Two adjacent parallel polysilicon bit lines $BL_{11}$, $BL_{12}$ communicate with the eight dynamic RAM cells 22A through 22H of subarray 20a. Note that while the use of polysilicon bit lines is the preferred embodiment of the invention, in other embodiments a second layer of metal or other media could be use instead.

The polysilicon bit lines $BL_{11}$ and $BL_{12}$ are coupled to the eight RAM cells 22A through 22H in an alternating and staggered fashion. Alternately stated, each bit line is coupled to alternating pairs of cells (a pair comprising two cells from a single row of memory cells but on opposite sides of the pair of bit lines) by means of buried contacts to the common drain areas of the cell pair which are arranged in an alternating and staggered fashion. For example, bit line $BL_{11}$ communicates with RAM cells 22B, 22D, 22E and 22G, while bit line $BL_{12}$ communicates with RAM cells 22A, 22C, 22F and 22H.

Each bit line $BL_{11}$, $BL_{12}$ is coupled to one input of the standard differential sense amps SA1 and SA2. The other input of each of the sense amps SA1 and SA2 is coupled to a dynamic RAM array (not shown) which is configured as a mirror circuit to array 20. In the preferred embodiment, to increase the ability of the sense amps to sense the voltage on its corresponding bit lines, each bit line $BL_{11}$, $BL_{12}$ is coupled to a dummy word line $WL_\phi$ through respective dummy capacitors 26, 27. Whenever a RAM cell (not shown) in the mirror array is accessed, the dummy word line $WL_\phi$ is accessed to give each bit line $BL_{11}$, $BL_{12}$ a predefined capacitance boost. Other dummy cell embodiments will be apparent to those familiar with the art. Furthermore, in other embodiments a dummy word line is not needed at all if "zero balance" equilibration techniques are used (e.g., if the bit lines on both sides of the sense amp are equalized to a voltage of $V_{CC}/2$ before the selected memory cell is accessed).

As shown in FIG. 3, in one embodiment subarray 20b is the mirror image (with respect to the bit line axis) of subarray 20a, and subarray 20c is the mirror image of subarray 20b. However, in other embodiments all the subarrays could be exactly the same instead of mirror images of one another. As shown in FIG. 5, each subarray can be formed so as to be independent of the form of its neighboring subarrays. Referring again to the embodiment shown in FIG. 3, the word lines are connected to pairs of adjacent memory cells in a pattern of alternating pairs of pairs (i.e., each word line is connected to two successive pairs of memory cells, then skips two successive pairs of memory cells, and so on). In the alternate embodiment (i.e., wherein all subarrays are identical) the word lines are connected to every other pair of adjacent memory cells (i.e., in a strictly alternating pattern).

Figure 4:
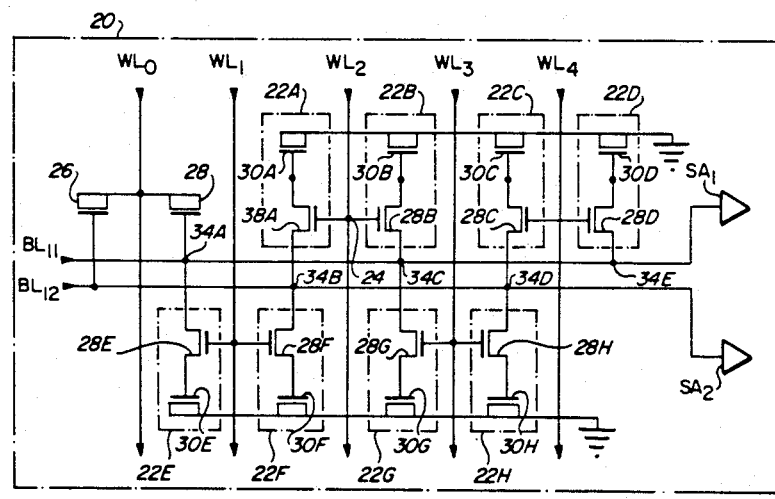
FIG. 4 is a schematic diagram of one of the eight-cell memory arrays shown in FIG. 3.

FIG. 4 is a more detailed diagram of the eight-cell memory array 20 shown in FIG. 3. Each RAM cell 22A through 22H comprises a single MOS transistor (i.e., FET transfer device) 28A through 28H and a single MOS storage capacitor 30A through 30H. Each MOS transistor 28A through 28H has its gate coupled to one of the word lines $WL_1$ through $WL_4$. For example, the gates of MOS transistors 28A and 28B of adjacent cells 22A and 22B are coupled to the word line $WL_2$ at node 24. Further, each of the transistors 28A through 28H has its drain communicating with one of the polysilicon bit lines $BL_{11}$, $BL_{12}$. For example, the drain of MOS transistor 28A crosses under bit line $BL_{11}$ and is connected to bit line $BL_{12}$, while the drain of MOS transistor 28B connects directly to bit line $BL_{11}$. Each of the storage capacitors 30A through 30H has its capacitor plate coupled to the source of their respective transistors 28A through 28H. Each storage capacitor 30A through 30H is substantially isolated from the substrate by an A.C. grounded P-N junction (i.e., a P-N junction wherein the P side is the substrate and the N side is tied to a steady voltage potential), as will be explained below with reference to FIGS. 5 and 6. Thus, in operation, the polysilicon capacitor plate functions as the storage node and is effectively isolated from any substrate voltage variations.

FIG. 5 is a partial plan view of the eight cell memory array 20 of FIG. 4 but drawn as though the memory array continues onwards on the lefthand side of the figure. The regions 54, 64, 74 and 84 are polysilicon gate regions having contact regions 56, 66, 76 and 86 respectively for metal word lines (not shown). Two parallel polysilicon bit lines $BL_{11}$ and $BL_{12}$ and polysilicon capacitor plates 98, 100 and 102 are formed concurrently with gate regions 54, 64, 74 and 84 in a single-level polysilicon process. All polysilicon areas are shown as speckled regions in the drawing. N+ region 94 serves as a counter-electrode for capacitor plates 98, 100 and 102 lying over a thin dielectric, such as silicon dioxide (not shown). N+ region 94 is A.C. grounded (i.e., tied to a steady voltage potential) to electrically isolate the storage capacitors from the substrate. Regions 38, 40 and 42 and N+ portions which form source regions 38S, 39S, 40S, 41S, 42S and 43S and drain regions 38D, 39D, 40D, 41D, 42D and 43D for the MOS transistors defined by the polysilicon gate regions 54, 64, 74 and 84 which lie on either side of the pair of parallel bit lines $BL_{11}$ and $BL_{12}$. Each of the N+ drain portions 38D, 39D, 40D, 41D, 42D and 43D makes contact to one of the bit lines $BL_{11}$ and $BL_{12}$ by buried contacts 34A, 34B and 34C, and each of the N+ source portions 38S, 40S and 42S makes contact with one of the capacitor plates 98, 100 and 102 by buried contacts 104, 106 and 108. All buried contacts are shown as cross-hatched regions. The N portions 38D, 41D and 42D are connected under one of the bit lines by virtue of N+ undercross regions 44, 46 and 48, which are insulated from the bit lines by a thick oxide. Regions 44, 46 and 48 define both N+ (e.g., arsenic) implant and thick oxide growth regions. The N+ undercross, thick oxide and overlying bit line can be viewed as forming a depletion mode transistor which is in a conducting state regardless of the voltage on the bit line, or simply as two connectors isolated by a thick oxide.

Still referring to FIG. 5, and taking the N+ portions 40 as an example, the capacitor comprising the polysilicon region 100 and the N+ regions 94 (separated vertically by the capacitor dielectric 96, shown in FIG. 6) may be charged by simultaneously applying positive signals to gate region 54 (via contact 56 to a metal word line) and bit line $BL_{12}$. Similarly, any of the other capacitors may be selectively charged by a unique choice of address signals.

Continuing to refer to FIG. 5, the pair of parallel polysilicon bit lines $BL_{11}$ and $BL_{12}$ make alternating and staggered contacts to the N+ drain regions 38D, 39D, 40D, 41D, 42D and 43D. The metal word lines (not shown) are perpendicular to the paired bit lines. Three separate lines would contact the regions 56, 66 and 76, which each serve as a common or shared gate contact for a pair of MOS transistors comprising two cells of the array. Since the array is repetitive, rows of memory cells alternate with word lines in one direction, while pairs of bit lines alternate with pairs of columns of cells in the other direction, as may be additionally envisioned with reference to FIG. 3.

Referring now to FIG. 6, which is a cross-sectional view of individual memory cell 22F, the basic operation of the circuit will be discussed. It is apparent that an additional isolation layer must be deposited prior to depositing the metal word line $WL_1$. The isolation layer and the word line $WL_1$ are not shown in FIG. 6 in order to present a simplified cross-section of the memory cells.

Operation is assumed to begin with no charge stored on the storage plate 100 and with neither the bit line $BL_{12}$ nor the word line $WL_1$ accessed. When word line $WL_1$ is accessed, transistor 28F is activated with the gate region 54 receiving more than sufficient voltage from word line $WL_1$ to form a conducting channel between the N+ source 40S and drain 40D regions. To write a "1" into memory capacitor 30F, the bit line $BL_{12}$ is accessed, pulling the drain 40D to a positive voltage. The storage capacitor plate 100 is contacted at 106 to the N+ source 40S, and correspondingly assumes a positive voltage. Note that when word line $WL_2$ is accessed, transistor 28A is switched on since the gate 64 of transistor 28A receives a positive voltage, forming a conducting channel between the N+ source 41S and the N+ drain 41D and connecting capacitor 30A to bit line $BL_{12}$.

Since the storage plate 100 is substantially isolated from the substrate 50 by the junction formed by the N+ region 94 and the substrate 50, the charge stored on the capacitor plate 100 remains relatively constant regardless of variations in substrate potential. Further, because the charge is stored on the polysilicon plate 100 and N region 94 instead of an inverted substrate region, the reference voltage of the N+ region 94 can be ground or any other voltage sufficient to keep the substrate/N+ region 94 junction reverse biased, since the N+ region 94 only needs a constant D.C. potential to effect storage of charge on the capacitor 30F. Doped P regions 110 and 112 provide isolation between the N+ region 94 of the capacitor 30F and the N+ region 40S of transistor 28F and N+ region 114 of the mirror configured capacitor of an adjacent cell 31.

In another embodiment of the invention, shown in FIG. 7, region 116 in the substrate receives additional P implant 116, which preferably comprises a heavy concentration of boron, prior to forming the N+ region 94, thereby limiting the spreading of the depletion layer between N+ region 94 and the substrate. The P implant 116 allows isolation region 112 to be narrower than shown in FIG. 6 and thus allows closer capacitor-to-transfer device spacing, thereby reducing the column-to-column pitch of the memory cell, or allowing more cell storage capacitance for a given cell area.

In yet another embodiment of the invention, shown in FIG. 8, the capacitor 30F is shown modified to accommodate V-groove technology. The use of a heavy V-groove P implant 116 of boron followed by arsenic prevents the depletion layer from spreading in the substrate. The doped N+ region 94, dielectric layer 96, and polysilicon plate 100 are similarly fabricated according to known V-groove technology. The V-groove adaptation shown in FIG. 8 results in approximately doubling the storage capabilities of the memory capacitor 30F shown in FIG. 6.

In a fourth embodiment of the invention shown in FIG. 9, a second dielectric layer 118 is grown on top of the polysilicon capacitor plate 100 and another polysilicon layer 120 is added on the second dielectric layer 118. The polysilicon 100-dielectric 118-polysilicon 120 sandwich forms a second storage capacitor. The polysilicon layer 120 is normally tied to a reference voltage, such as ground. Such a configuration is similar to the standard double-ply technology and results in doubling the storage capabilities of the capacitor 30F shown in FIG. 6.

It should be evident to one skilled in the art that a combination of the V-groove and double-poly structures shown in FIGS. 8 and 9 could increase the capacitance of capacitor 30F shown in FIG. 6 by as much as four times.

One method of forming very narrow bit lines $BL_{11}$ and $BL_{12}$ is discussed with reference to FIG. 10A through FIG. 10E. The use of very narrow bit lines reduces bit line capacitance. While not essential to the invention in its main aspect, the use of these narrow, "edge-defined" bit lines helps circuit performance and facilitates the use of very small memory cells. FIG. 10A shows the N+ region 40 in the substrate forming the N+ drain 40D for transistor 28F (not shown) and the N+ drain 41D for transistor 28A (not shown). The thick silicon dioxide layer 46 is grown over the N+ underpass region 121. A portion of the oxide layer 80 of the transistor 28A is simultaneously grown. Referring to FIG. 10B, a polysilicon layer 122 is deposited followed next by the deposition of a CVD (chemical vapor deposited) oxide layer 124. A mask whose edges define the position of the inner edges of bit lines $BL_{11}$ and $BL_{12}$ is used to develop a photo-resist layer 126. An anisotropic oxide etch is then utilized to etch the CVD oxide layer 124. Referring to FIG. 10C, a silicon-nitride CVD layer 128 is deposited over the polysilicon layer 122 and the unetched oxide layer 124. Referring to FIG. 10D, another anisotopic (e.g., plasma) etch is used to remove the silicon-nitride layer 128, leaving a "filament" of silicon-nitride on each side of the patterned oxide layer 124. Finally, referring to FIG. 10E, an oxide etch followed by an anisotropic polysilicon etch and then a nitride etch results in the formation of the edge-defined bit lines $BL_{11}$ and $BL_{12}$. The bit lines are very narrow because they correspond to the polysilicon area masked by the silicon-nitride filaments. The term "edge-defined" means that the bit lines are formed using a mask that defines the inner edges of the bit lines.

The use of the edge-defined process discussed above in reference to FIGS. 10A through 10E results in tighter spacing between the parallel bit lines and, hence, greater overall packing densities when repeated many times in a memory array. In addition, because the bit lines are not folded, as in some prior art memories, bit line capacitance is decreased, resulting in greater signal strength out of the memory cell.

While the edge-defined bit line process helps decrease the column-wise pitch of the memory cells, the use of a single polysilicon gate region for two adjacent FET transfer devices, as shown in FIG. 5, helps minimize the row-wise pitch of the memory cells. In order to fit a 256-K bit memory device into a standard 16-pin integrated circuit package the die size must be no more than about 3700 microns by 10,000 microns (i.e., 145 mils by 400 mils). A semiconductor memory in accordance with the present invention could use a 5.5 micron by 18 micron cell, with a 4 micron by 6 micron capacitor so that a 512 by 512 (i.e., 256-K bit) array will be 2816 microns by 9216 microns. This leaves sufficient room for sense amps and peripheral circuitry for the device to fit into a 16-pin package.

While the invention has been described with reference to preferred embodiments thereof, the description is illustrative of the invention and is not to be construed as limiting the invention. Various modifications may occur to those skilled in the art without departing from the true spirit and scope of the invention as defined by the appended claims.

What is claimed is:

1. A semiconductor memory comprising,
  an array of memory cells each including a single field effect transistor (FET) transfer device with its source coupled to the gate of a field effect transistor type capacitor;
  a plurality of word lines adjacent to corresponding rows of said memory cells, each word line coupled to half the memory cells in two memory cell rows adjacent thereto, wherein each word line is coupled to a plurality of pairs of the memory cells, each pair comprising two memory cells from a single column of memory cells but on opposite sides of said word line; and
  a plurality of paired adjacent bit lines interleaved with pairs of adjacent columns of said memory cells, said paired adjacent bit lines coupled to the memory cells adjacent thereto in an alternating pattern, wherein each bit line is coupled to alternating pairs of the memory cells, each pair comprising two memory cells from a single row of memory cells but on opposite sides of said paired adjacent bit lines;
  wherein the drain of the FET transfer device of each memory cell, excluding no more than one memory cell at alternating ends of each memory cell column, comprises a common drain area connected to the drain area of the FET transfer device of a second memory cell on the opposite side of the pair of adjacent bit lines therebetween, said common drain area being connected to only one of said pair of adjacent bit lines.

2. A semiconductor memory, comprising:
  an array of memory cells each including a single field effect transistor (FET) transfer device with its source coupled to the gate of a field effect transistor type capacitor;
  a plurality of word lines coupled to memory cells in corresponding rows of said memory cells;
  a plurality of bit lines coupled to memory cells in corresponding columns of said memory cells;
  wherein said bit lines are edge-defined bit lines formed by
  (a) forming a conductive layer on a semiconductor substrate;
  (b) forming a first masking layer over said conductive layer and patterning said first masking layer to define first layer masking lines located between each pair of bit lines being formed;
  (c) forming a second masking layer over said first masking layer;
  (d) anisotropically etching said second masking layer to form pairs of filaments of second masking layer material along the sides of said first layer masking lines;

(e) removing said first layer masking lines; and (f) etching said conductive layer, using said filaments of second masking layer material as a mask, to form said bit lines.

3. A semiconductor memory as set forth in claim 1 wherein each said common drain area is connected to one of said pair of adjacent bit lines by buried contact means; and wherein each said common drain area forms a conductance channel, the conductance of which is substantially unaffected by the bit line, from said pair of adjacent bit lines, not connected to the common drain area.

4. A semiconductor memory as set forth in claim 3 wherein each said word line includes a metal conductor, each said bit line includes a polysilicon conductor, and said semiconductor memory is formed on a silicon substrate.

5. A semiconductor memory as set forth in claim 4 wherein said FET devices comprise N-channel transistors.

6. A semiconductor memory as set forth in claim 4 wherein the diffusion area comprising the second plate of the FET type capacitor in each said memory cell is a.c. grounded, thereby substantially isolating said capacitor from voltage variations in the substrate of said semiconductor memory.

7. A semiconductor memory as set forth in claim 6 further including a row of sense amps between equal numbers of rows of memory cells with each sense amp connected to one bit line on each side thereof, whereby the capacitance of each bit line on each side of each sense amp is substantially balanced.

8. A semiconductor memory as set forth in claim 7 further including at least one dummy word line coupled to the bit lines on each side of said row of sense amps.

9. A semiconductor memory as set forth in claim 8 wherein said dummy word lines are capacitively coupled to said bit lines, whereby accessing a selected dummy word line gives a predefined capacitive boost to the bit lines coupled thereto.

10. A semiconductor memory as set forth in claim 7 wherein the substrate area below the diffusion area of each said FET type capacitor is implanted with doping of the same conductivity type as the substrate, thereby limiting the spreading of the depletion layer between said diffusion area and the substrate, whereby memory cell column to memory cell column spacing and FET transfer device to FET type capacitor spacing can be made closer than would otherwise be possible.

11. A semiconductor memory as set forth in claim 7 wherein said FET type capacitors are V-groove type devices.

12. A semiconductor memory as set forth in claim 6 wherein each said memory cell includes a second capacitor having as one plate the gate of said FET type capacitor and as a second plate a second conductive layer vertically displaced from said gate by a dialectric layer, said second conductive layer being connected to a substantially constant voltage potential.

13. A semiconductor memory as set forth in claim 6 wherein the gates of the FET transfer devices of each said pair of cells coupled to a corresponding word line together comprise a single contiguous polysilicon region.

14. A semiconductor memory as set forth in claim 6 wherein the row-wise pitch of said memory cells is less than or equal to 5.5 microns, whereby a semiconductor memory housing an array of 512 rows of said memory cells will fit in a standard 16-pin integrated circuit package.

15. A semiconductor memory as set forth in claim 6, wherein said bit lines are edge-defined bit lines.

* * * * *